(12) United States Patent
Bonilla et al.

(10) Patent No.: US 7,666,753 B2
(45) Date of Patent: Feb. 23, 2010

(54) METAL CAPPING PROCESS FOR BEOL INTERCONNECT WITH AIR GAPS

(75) Inventors: Griselda Bonilla, Fishkill, NY (US); Shyng-Tsong Chen, Patterson, NY (US); Matthew E. Colburn, Hopewell Junction, NY (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 496 days.

(21) Appl. No.: 11/622,188

(22) Filed: Jan. 11, 2007

(65) Prior Publication Data

US 2008/0169565 A1 Jul. 17, 2008

(51) Int. Cl.
*H01L 21/76* (2006.01)
(52) U.S. Cl. .................................... 438/421
(58) Field of Classification Search ................. 438/421, 438/637
See application file for complete search history.

(56) References Cited

U.S. PATENT DOCUMENTS

| | | | |
|---|---|---|---|
| 4,789,648 A | 12/1988 | Chow et al. | |
| 6,358,832 B1 | 3/2002 | Edelstein et al. | |
| 2006/0088975 A1* | 4/2006 | Ueda | 438/421 |
| 2007/0063348 A1* | 3/2007 | Yang et al. | 257/751 |

* cited by examiner

*Primary Examiner*—David A Zarneke
*Assistant Examiner*—Jenny L Wagner
(74) *Attorney, Agent, or Firm*—Gibb I.P. Law Firm, LLC; Katherine S. Brown, Esq.

(57) ABSTRACT

The embodiments of the invention provide a metal capping process for a BEOL interconnect with air gaps. More specifically an apparatus is provided comprising metal lines within a first dielectric. Metal caps are over the metal lines, wherein the metal caps contact the metal lines. In addition, air gaps are between the metal lines, wherein the air gaps are between the metal caps. A second dielectric is also provided over the bottom portion of a first dielectric, wherein a top portion of the second dielectric is over the metal caps, and wherein top portions of the first dielectric and bottom portions of the second dielectric comprise sides of the air gap. The apparatus further includes dielectric caps over the metal lines, wherein the dielectric caps contact the metal caps.

1 Claim, 5 Drawing Sheets

METAL CAPPING PROCESS FOR BEOL INTERCONNECT WITH AIR GAPS

BACKGROUND

1. Field of the Invention

The embodiments of the invention provide a metal capping process for a back end of line (BEOL) interconnect with air gaps.

2. Description of the Related Art

Metallization patterns on integrated circuits can be formed by depositing a dielectric layer, patterning the dielectric layer by photolithography and reactive ion etching (RIE) to form a groove or trench, and depositing a metal layer that fills the trench in the dielectric layer. The metal layer typically not only fills the trenches but also covers the entire semiconductor wafer. Therefore, the excess metal is removed using either chemical-mechanical planarization (CMP) or an etch back process so that only the metal in the trenches remains.

This process, called the "damascene process," forms conductors in-laid in the dielectric layer. The term "damascene" is derived from the name of a centuries-old process used to fabricate a type of in-laid metal jewelry first seen in the city of Damascus. In the context of integrated circuits, damascene means formation of a patterned layer imbedded on and in another layer such that the top surfaces of the two layers are coplanar. Planarity is essential to the formation of fine-pitch interconnect levels because lithographic definition of fine features is achieved using high-resolution steppers having small depths of focus. The "dual damascene" process, in which conductive lines and stud via metal contacts are formed simultaneously, is described in U.S. Pat. No. 4,789,648 issued to Chow.

As wire widths in integrated circuits continue to shrink, the electrical conductivity of the wiring material becomes increasingly more important. The material of choice since the integrated circuit art began, aluminum, is becoming less attractive than other materials, such as gold, copper, and silver, which are better conductors. In addition to processing superior electrical conductivity, these materials are more resistant than aluminum to electromigration, a property that increases in importance as wire cross-sectional areas decrease and applied current densities increase. In particular, copper is seen as an attractive replacement for aluminum because copper offers low cost, ease of processing, lower susceptibility to electromigration, and lower resistivity.

Metal caps on copper lines are the only way to improve the electromigration life time significantly. However, the selective metal cap deposition is often difficult and not manufacturable. A manufacturably feasible way to deposit metal caps on copper lines is needed.

SUMMARY

The embodiments of the invention provide a metal capping process and structure for a BEOL interconnect with air gaps. More specifically an apparatus is provided comprising metal lines with a first dielectric. Metal caps are over the metal lines, wherein the metal caps contact the metal lines. The metal lines can comprise copper, and, the metal caps comprise tantalum (Ta) with tantalum oxide (TaOx), tantalum nitride (TaNx) and other tantalum alloys, cobalt (Co) with cobalt oxide (CoOx), cobalt nitride (CoNx) and other cobalt alloys, titanium (Ti) with titanium oxide (TiOx), titanium nitride (TiNx) and other titanium alloys, ruthenium (Ru) with ruthenium oxide (RuOx), or ruthenium nitride (RuNx) and other ruthenium alloys, rhodium (Rh) with rhodium oxide (RhOx), rhodium nitride (RhNx) and other rhodium alloys, indium (In) with indium oxide (InOx), indium nitride (InNx) and other indium alloys, iridium (Ir) with iridium oxide (IrOx), iridium nitride (IrNx) and other iridium alloys. Other metal, metal compound and their oxide and nitride can also be used. The metal layer is deposited via physical vapor deposition (PVD), chemical vapor deposition (CVD), or atomic layer deposition (ALD) deposition techniques.

In addition, air gaps are between the metal lines, wherein the air gaps are between the metal caps. A second dielectric is also provided over a portion of the first dielectric, wherein a portion of the second dielectric is over the metal caps, and wherein portions of the first dielectric and portions of the second dielectric comprise sides of the air gaps. The apparatus further includes dielectric caps over the metal lines, wherein the dielectric caps contact the metal caps.

The embodiments of the invention also include a method, comprising forming metal lines within a first dielectric such that the metal lines comprise copper. Next, a metal layer is formed over the metal lines and a top portion of the first dielectric, such that the metal layer contacts the metal lines and such that the metal layer comprises tantalum (Ta) with tantalum oxide (TaOx), tantalum nitride (TaNx) and other tantalum alloys, cobalt (Co) with cobalt oxide (CoOx), cobalt nitride (CoNx) and other cobalt alloys, titanium (Ti) with titanium oxide (TiOx), titanium nitride (TiNx) and other titanium alloys, ruthenium (Ru) with ruthenium oxide (RuOx), or ruthenium nitride (RuNx) and other ruthenium alloys, rhodium (Rh) with rhodium oxide (RhOx), rhodium nitride (RhNx) and other rhodium alloys, indium (In) with indium oxide (InOx), indium nitride (InNx) and other indium alloys, iridium (Ir) with iridium oxide (IrOx), iridium nitride (IrNx) and other iridium alloys. Other metal, metal compound and their oxide and nitride can also be used. The metal layer is deposited via PVD, CVD, or ALD deposition techniques.

Following this, protective covers are formed over the metal layer, such that the protective covers are formed only over the metal lines. An etching process is subsequently performed to remove portions of the metal layer and portions of the first dielectric that are not under the protective covers, such that the metal layer is patterned into metal caps over the metal lines. The method then removes the protective covers and forms a second dielectric over the metal caps, such that air gaps are formed between the metal lines, and such that the air gaps are formed between the metal caps.

It is recognized that prior to the forming of the protective covers, the method could form a dielectric layer on the metal layer, wherein the etching process can remove portions of the dielectric layer that are not under the protective covers, such that the dielectric layer is patterned into dielectric caps over the metal lines.

Accordingly, the embodiments of the invention provide a metal capping process for a BEOL interconnect with air gaps. The BEOL interconnect structure built with air gaps has a post cap etch through the cap into an inter-layer dielectric (ILD) to create the air gaps. The etching process can be optimized to etch the cap with a thin metal layer in it. This means a selective metal cap deposition process is not needed. The thin metal liner layer is deposited post chemical mechanical planarization (CMP) with an optional thin dielectric cap on top of it. The metal cap can be formed from the metal layer between the copper metal lines.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 3 is a diagram illustrating patterned metal caps and patterned dielectric caps over the copper lines with air gaps in between.

DETAILED DESCRIPTION OF PREFERRED EMBODIMENTS

Figure 1:
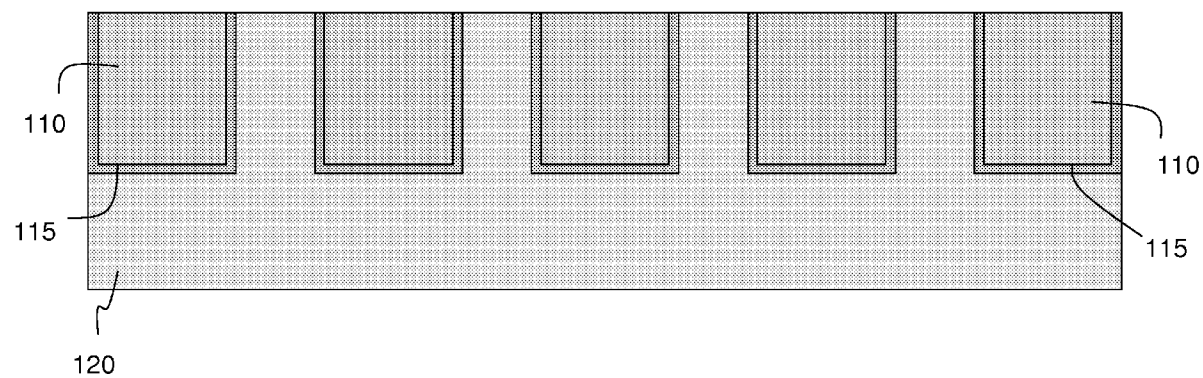
FIG. 1 is a diagram illustrating copper lines in a dielectric.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The embodiments of the invention provide a metal capping process for a BEOL interconnect with air gaps. The BEOL interconnect structure built with air gaps has a post cap etch through the cap into an ILD to create the air gaps. The etching process can be optimized to etch the cap with a thin metal layer in it. This means a selective metal cap deposition process is not needed. The thin metal liner layer is deposited post chemical mechanical planarization CMP with an optional thin dielectric cap on top of it. The metal cap can be formed from the metal layer between the copper metal lines.

Referring now to FIGS. 1-4, a method of forming metal/dielectric hybrid caps on copper lines in an interconnect structure with an air bridge is illustrated. More specifically, FIG. 1 illustrates a cross-sectional view of copper lines 110 (also referred to herein as the "metal lines") in upper portions of a dielectric 120 (also referred to herein as the "first dielectric"). Barrier members 115 are on the bottom and sides of the copper lines 110 such that the barrier members 115 form substantially "U-shaped" structures. The barrier members 115 can be formed from metal, wherein the barrier members 115 separate the copper lines 110 from the dielectric 120. Specifically, inner walls of the barrier members 115 can contact the copper lines 110, and, outer walls of the barrier members 115 can contact the dielectric 120. After CMP is performed, top surfaces of the copper lines 110, the barrier members 115, and the dielectric 120 are coplanar with each other. Details of similar processes are described in U.S. Pat. No. 6,358,832 to Edelstein et al., which is fully incorporated herein by reference.

Figure 2:
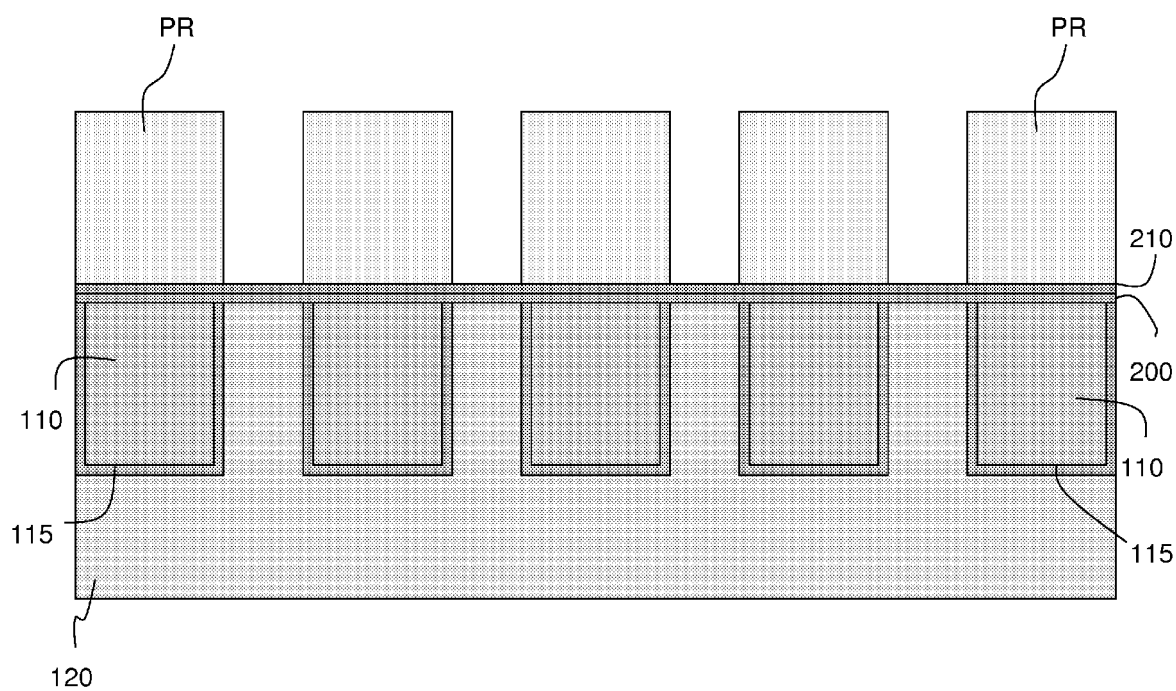
FIG. 2 is a diagram illustrating a blanket metal capping layer, a blanket dielectric capping layer, and patterned photoresists over the copper lines.

Next, as illustrated in FIG. 2, a blanket metal layer 200 is formed on the top surfaces of the copper lines 110, the barrier members 115, and the dielectric 120. The metal layer 200 could be formed from tantalum (Ta) with tantalum oxide (TaOx), tantalum nitride (TaNx) and other tantalum alloys, cobalt (Co) with cobalt oxide (CoOx), cobalt nitride (CoNx) and other cobalt alloys, titanium (Ti) with titanium oxide (TiOx), titanium nitride (TiNx) and other titanium alloys, ruthenium (Ru) with ruthenium oxide (RuOx), or ruthenium nitride (RuNx) and other ruthenium alloys, rhodium (Rh) with rhodium oxide (RhOx), rhodium nitride (RhNx) and other rhodium alloys, indium (In) with indium oxide (InOx), indium nitride (InNx) and other indium alloys, iridium (Ir) with iridium oxide (IrOx), iridium nitride (IrNx) and other iridium alloys. Other metal, metal compound and their oxide and nitride can also be used. The metal layer is deposited via PVD, CVD, or ALD deposition techniques.

In the chemical equations used herein, "x" represents any number subscript. A dielectric layer 210 is then formed on the metal layer 200. The dielectric layer 210 could be formed from thin silicon carbon nitride (SiCN) or silicon carbide with hydrogen (SiCHx), low dielectric constant (low-k) caps such as silicon carbide (SiCx), silicon boron carbide (SiBC), silicon boron nitride (SiBN), boron nitride (BN), and carbon (C); bilayer caps such as low-k layer/SiCN or SiCHx; and, other similar materials. Following this, photoresists PR (also referred to herein as the "protective covers" or masks) are positioned (patterned, formed) on the dielectric layer 210 such that the photoresists PR are over the copper lines 100 and the barrier members 115.

Figure 3:
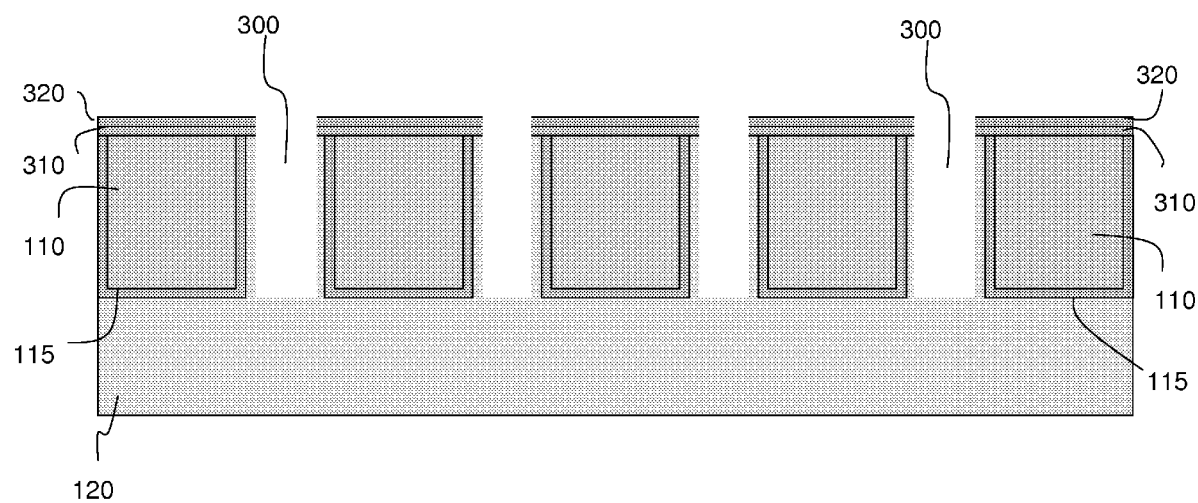

As illustrated in FIG. 3, the method then performs an etching process that forms recesses 300 in the dielectric layer 210, the metal layer 200, and the dielectric 120. Specifically, the recesses 300 are formed by removing portions of the dielectric layer 210, portions of the metal layer 200, and portions of the dielectric 120 that are not covered by the photoresists PR. Thus, the recesses 300 are positioned between the barrier members 115. Moreover, the recesses 300 can be rectangular-shaped, wherein the bottoms of the recesses 300 can be coplanar with or deeper than the bottoms of the barrier members 115. The photoresists PR are subsequently removed.

Thus, metal caps 310 and dielectric caps 320 are formed over the copper lines 110 and the barrier members 115, wherein the metal caps 310 are between the dielectric caps 320 and the copper lines 110 and the barrier members 115. The metal caps 310 and the dielectric caps 320 are equal in width, wherein top surfaces of the metal caps 310 contact bottom surfaces of the dielectric caps 320. Furthermore, side edges of the metal caps 310 and side edges of the dielectric caps 320 are over portions of the dielectric 120 that are on outer sidewalls of the barrier members 115.

Figure 4:
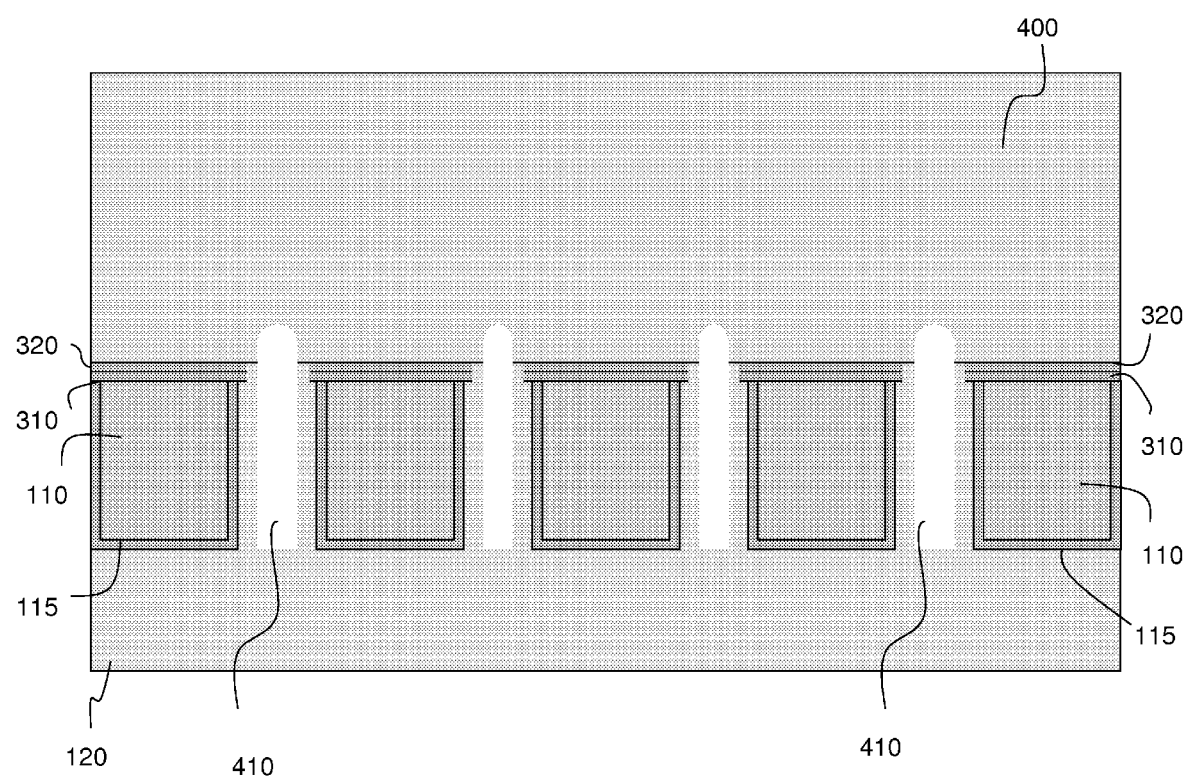
FIG. 4 is a diagram illustrating a second dielectric over the metal caps.

Subsequently, as illustrated in FIG. 4, a next level ILD 400 (also referred to herein as the "second dielectric") is deposited over the recesses 300 to form air gaps 410 between the copper lines 110. Specifically, dielectric material is formed on top surfaces of the dielectric caps 320, sidewalls of the dielectric caps 320, sidewalls of the metal caps 310, and in sides of the recesses 300. Further, the air gaps 410 are formed such that top portions of the air gaps 410 extend above the top surfaces of the dielectric caps 320, wherein the top portions of the air gaps 410 could be arch-shaped, rounded, curved, etc.

Accordingly, the embodiments of the invention provide a metal capping process for a BEOL interconnect with air gaps. More specifically an apparatus is provided comprising metal lines with a first dielectric. As described above, barrier members can be formed on the bottom and sides of the metal lines such that the barrier members form substantially "U-shaped" structures. Metal caps are over the metal lines, wherein the metal caps contact the metal lines. The metal lines can comprise copper; and, the metal caps can comprise Ta with TaOx, TaNx, Co with CoOx, CoNx, Ti with TiOx, TiNx, Ru with RuOx, RuNx, and other similar materials. As described above, the metal caps are also over the barrier members.

In addition, air gaps are between the metal lines, wherein the air gaps are between the metal caps. As described above, top portions of the air gaps extend above the top surfaces of the metal caps, wherein the top portions of the air gaps could be arch-shaped. A second dielectric is also provided over a bottom portion of the first dielectric, wherein a top portion of the second dielectric is over the metal caps, and wherein top portions of the first dielectric and bottom portions of the second dielectric comprise sides of the air gaps. As described above, the second dielectric is on sidewalls of the metal caps and in sides of the recesses. The apparatus further includes dielectric caps over the metal lines, wherein the dielectric caps contact the metal caps. As described above, the dielectric caps are between the metal caps and the second dielectric.

The embodiments of the invention also include a method, comprising forming metal lines within a first dielectric such that the metal lines comprise copper. As described above, barrier members can be formed on the bottom and sides of the metal lines such that the barrier members form substantially "U-shaped" structures. The barrier members can be formed from metal, wherein the barrier members separate the metal lines form the first dielectric.

Next, a metal layer is formed over the metal lines and a top portion of the first dielectric, such that the metal layer contacts the metal lines, and such that the metal layer comprises Ta with TaOx, TaNx, Co with CoOx, CoNx, Ti with TiOx, TiNx, Ru with RuOx, or RuNx. As described above, the metal layer is formed on the top surfaces of the metal lines, the barrier members, and the first dielectric.

Following this, protective covers are formed over the metal layer, such that the protective covers are formed only over the metal lines. As described above, the protective covers are also positioned on the dielectric layer and over the barrier members. An etching process is subsequently performed to remove portions of the metal layer and portions of the first dielectric that are not under the protective covers, such that the metal layer is patterned into metal caps over the metal lines. As described above, this forms recesses in the dielectric layer, the metal layer, and the first dielectric. Thus, the recesses are positioned between the barrier members, wherein the recesses can be rectangular-shaped, and wherein the bottoms of the recesses can be coplanar with or deeper than the bottoms of the barrier members.

The method then removes the protective covers and forms a second dielectric over the metal caps, such that air gaps are formed between the metal lines, and such that the air gaps are formed between the metal caps. As described above, dielectric material is formed on sidewalls of the dielectric caps, sidewalls of the metal caps, and in sides of the recesses. Further, the top portions of the air gaps could be arch-shaped.

It is recognized that prior to the forming of the protective covers, the method could form a dielectric layer on the metal layer, wherein the etching process can remove portions of the dielectric layer that are not under the protective covers, such that the dielectric layer is patterned into dielectric caps over the metal lines. As described above, the dielectric caps are formed over the metal lines and the barrier members, wherein the metal caps are between the dielectric caps and the copper lines and the barrier members.

Figure 5:
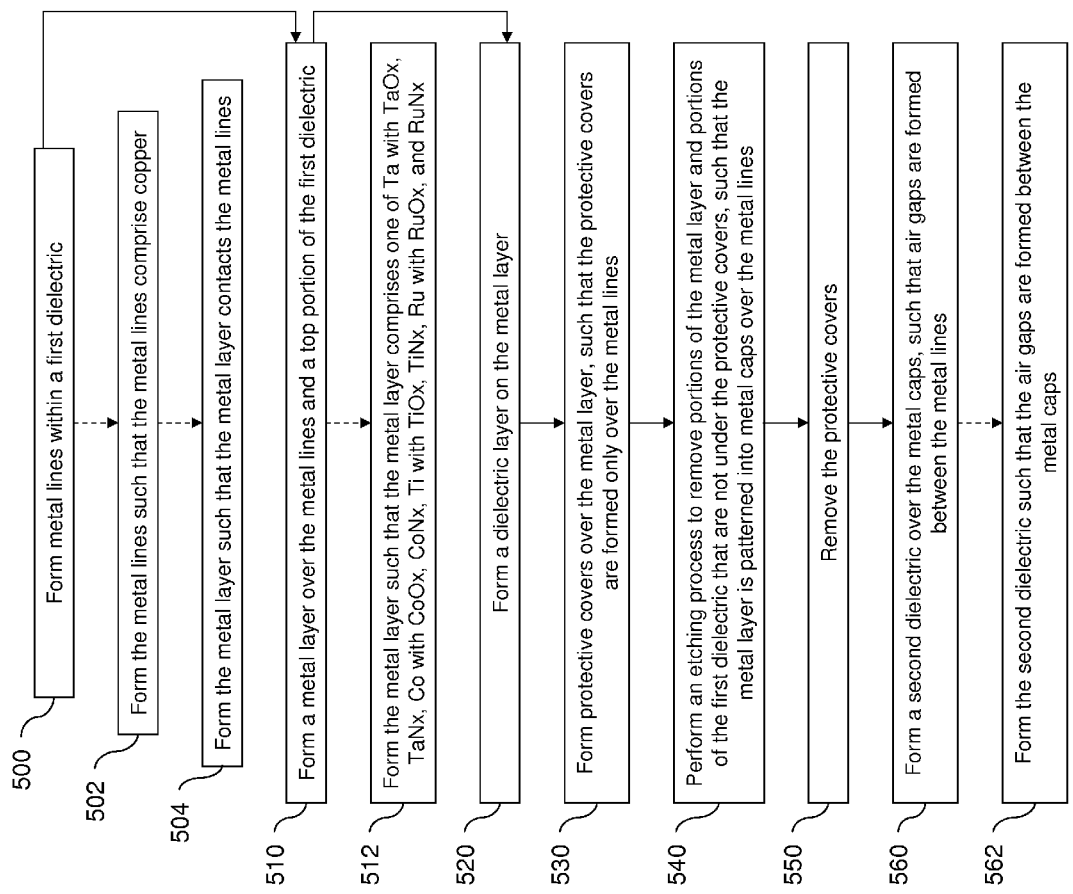
FIG. 5 is a flow diagram illustrating a method of a metal capping process for a BEOL interconnect with air gaps.

FIG. 5 is a flow diagram illustrating a method of a metal capping process for a BEOL interconnect with air gaps. The method begins in item 500 by forming metal lines within a first dielectric. This involves forming the metal lines such that the metal lines comprise copper (item 502) and forming the metal layer such that the metal layer contacts the metal lines (item 504). As described above, barrier members can be formed on the bottom and sides of the metal lines such that the barrier members form substantially "U-shaped" structures. The barrier members can be formed from metal, wherein the barrier members separate the metal lines from the first dielectric.

Next, in item 510, a metal layer is formed over the metal lines and a top portion of the first dielectric. This includes forming the metal layer such that the metal layer comprises one of tantalum (Ta) with tantalum oxide (TaOx), tantalum nitride (TaNx) and other tantalum alloys, cobalt (Co) with cobalt oxide (CoOx), cobalt nitride (CoNx) and other cobalt alloys, titanium (Ti) with titanium oxide (TiOx), titanium nitride (TiNx) and other titanium alloys, ruthenium (Ru) with ruthenium oxide (RuOx), or ruthenium nitride (RuNx) and other ruthenium alloys, rhodium (Rh) with rhodium oxide (RhOx), rhodium nitride (RhNx) and other rhodium alloys, indium (In) with indium oxide (InOx), indium nitride (InNx) and other indium alloys, iridium (Ir) with iridium oxide (IrOx), iridium nitride (IrNx) and other iridium alloys. Other metal, metal compound and their oxide and nitride can also be used. The metal layer is deposited via PVD, CVD, or ALD deposition techniques (item 512). As described above, the metal layer is formed on the top surfaces of the metal lines, the barrier members, and the first dielectric. In item 520, a dielectric layer is formed on the metal layer. As described above, the dielectric layer could be formed from thin SiCNx or SiCHx, low-k caps such as SiCx, SiBC, SiBN, BN, and C, bilayer or multilayer caps with two or more layers of those materials; and, other similar materials.

Following this, in item 530, protective covers are formed over the metal layer, such that the protective covers are formed only over the metal lines. As described above, the protective covers are also positioned on the dielectric layer and over the barrier members. Subsequently, in item 540, an etching process is performed to remove portions of the metal layer and portions of the first dielectric that are not under the protective covers, such that the metal layer is patterned into metal caps over the metal lines. As described above, this forms recesses in the dielectric layer, the metal layer, and the first dielectric. Thus, the recesses are positioned between the barrier members, wherein the recesses can be rectangular-shaped, and wherein the bottoms of the recesses can be coplanar with or deeper than the bottoms of the barrier members.

In item 550, the method then removes the protective covers. In addition, in item 560, a second dielectric is formed over the metal caps, such that air gaps are formed between the metal lines. This involves forming the second dielectric such that the air gaps are formed between the metal caps (item 562). As described above, dielectric material is formed on sidewalls of the dielectric caps, sidewalls of the metal caps, and in sides of the recesses. Further, the top portions of the air gaps could be arch-shaped or other shaped.

Furthermore, in regards to the forming of the dielectric layer in item 520, the performing of the etching process (item 540) removes portions of the dielectric layer that are not under the protective covers, such that the dielectric layer is patterned into dielectric caps over the metal lines. As described above, the dielectric caps and the metal caps are equal in width, wherein top surfaces of the metal caps contact bottom surfaces of the dielectric caps. Furthermore, side edges of the metal caps and side edges of the dielectric caps are over portions of the first dielectric that are on outer sidewalls of the barrier members.

Accordingly, the embodiments of the invention provide a metal capping process for a BEOL interconnect with air gaps. The BEOL interconnect structure built with air gaps has a post cap etch through the cap into an ILD to create the air gaps. The etching process can be optimized to etch the cap with a thin metal layer in it. This means a selective metal cap deposition process is not needed. The thin metal liner layer is deposited post chemical mechanical planarization CMP with an optional thin dielectric cap on top of it. The metal cap can be formed from the metal layer between the copper metal lines.

The foregoing description of the specific embodiments will so fully reveal the general nature of the invention that others can, by applying current knowledge, readily modify and/or adapt for various applications such specific embodiments without departing from the generic concept, and therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method, comprising:

forming metal lines within a first dielectric, wherein said forming of said metal lines comprises forming said metal lines such that said metal lines comprise copper;

forming a metal layer over said metal lines and a top portion of said first dielectric, wherein said forming of said metal layer comprises forming said metal layer such that said metal layer contacts said metal lines, wherein said forming of said metal layer comprises forming said metal layer such that said metal layer comprises one tantalum (Ta) with tantalum oxide (TaOx), tantalum nitride (TaNx), tantalum alloys, cobalt (Co) with cobalt oxide (CoOx), cobalt nitride (CoNx), cobalt alloys, titanium (Ti) with titanium oxide (TiOx), titanium nitride (TiNx), titanium alloys, ruthenium (Ru) with ruthenium oxide (RuOx), ruthenium nitride (RuNx), ruthenium alloys, rhodium (Rh) with rhodium oxide (RhOx), rhodium nitride (RhNx), rhodium alloys, indium (In) with indium oxide (InOx), indium nitride (InNx), indium alloys, iridium (Ir) with iridium oxide (IrOx), iridium nitride (IrNx), iridium alloys, metal compounds with an associated metal oxide, and a metal nitride, and wherein said forming of said metal layer comprises depositing said metal layer via one of a PVD, a CVD, and a ALD deposition technique;

forming a dielectric layer on said metal layer;

forming protective covers over said metal layer, such that said protective covers are formed only over said metal lines;

performing an etching process to remove portions of said metal layer and portions of said first dielectric that are not under said protective covers, such that said metal layer is patterned into metal caps over said metal lines, wherein said performing of said etching process removes portions of said dielectric layer that are not under said protective covers, such that said dielectric layer is patterned into dielectric caps over said metal lines;

removing said protective covers; and forming a second dielectric over said metal caps, such that air gaps are formed between said metal lines, wherein said forming of said second dielectric comprises forming said second dielectric such that said air gaps are formed between said metal caps.

* * * * *